United States Patent

Higashi et al.

(12) United States Patent
(10) Patent No.: US 7,622,317 B2
(45) Date of Patent: Nov. 24, 2009

(54) LIGHT EMITTING DIODE AND METHOD FOR MANUFACTURING THE SAME

(75) Inventors: Mitsutoshi Higashi, Nagano (JP); Akinori Shiraishi, Nagano (JP); Hideaki Sakaguchi, Nagano (JP); Yuichi Taguchi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 274 days.

(21) Appl. No.: 11/469,026

(22) Filed: Aug. 31, 2006

(65) Prior Publication Data

US 2007/0051966 A1    Mar. 8, 2007

(30) Foreign Application Priority Data

Sep. 2, 2005    (JP)    ............... 2005-254724

(51) Int. Cl.
    *H01L 21/00*    (2006.01)
(52) U.S. Cl. .............. 438/35; 438/29; 257/89; 257/98; 257/E21.528; 257/E33.061
(58) Field of Classification Search ............ 438/29, 438/35; 257/E33.001, E33.061, E21.528, 257/89
See application file for complete search history.

(56) References Cited

U.S. PATENT DOCUMENTS 5,998,925 A * 12/1999 Shimizu et al. ............. 313/503

FOREIGN PATENT DOCUMENTS

JP    2000-223749    8/2000

OTHER PUBLICATIONS

Hummel, R. E.; Electronic Properties of Materials; 2001; Springer-Verlag New Yoprk, Inc.; pp. 263-264 and 279-281.*
McGraw-Hill Dictionary of Scientific and Technical Terms; 2003; Sixth Edition; McGraw-Hill Companies, Inc; p. 1246.*

* cited by examiner

*Primary Examiner*—David S Blum
*Assistant Examiner*—Vicki B Booker
(74) *Attorney, Agent, or Firm*—Rankin, Hill & Clark LLP

(57) ABSTRACT

A light emitting diode includes an LED element, a fluorescent material provided so as to cover the LED element, a substrate on which the LED element is mounted and made of ceramics or silicon, and a pair of electrode pads which are electrically connected to the LED element on the substrate.

5 Claims, 5 Drawing Sheets

LIGHT EMITTING DIODE AND METHOD FOR MANUFACTURING THE SAME

This application claims foreign priority based on Japanese Patent application No. 2005-254724, filed Sep. 2, 2005, the content of which is incorporated herein by reference in its entirety.

BACKGROUND OF THE INVENTION

1. Field of the Invention

The present invention relates to a light emitting diode (LED) and a manufacturing method thereof, and more particularly to a light emitting diode which includes an LED element and a fluorescent material which covers the LED element and a manufacturing method thereof.

2. Description of the Related Art

Among light emitting diodes there are light emitting diodes which emit white light (hereinafter, referred to as white light emitting diodes). Among the white light emitting diodes there are a white light emitting diode which is configured with an LED (Light Emitting Diode) element which emits blue light and a fluorescent material which emits yellow light (for example, a YAG-based fluorescent material, YAG: Yttrium, Aluminium, Garnet), and a white light emitting diode which is configured with an LED element which emits a near-ultraviolet ray and fluorescent materials of three colors of red, blue and green.

As for the white light emitting diode configured with the blue light emitting LED element and the fluorescent material which emits yellow light, a white light can be obtained when the blue light from the LED element and the yellow light from the fluorescent material are mixed up.

A plurality of white light emitting diodes like the one describe above are mounted for use on a printed circuit board. When a white light emitting diode is mounted on a printed circuit board, initially, an LED element is electrically connected to pads on the printed circuit board, and following this, a fluorescent material is formed in such a manner as to cover the LED element so mounted (for example, refer to JP-A-2000-223749).

The fluorescent material can be formed by a printing method using a metallic mask. In the case of the printing method, a metallic mask having an opening through which the LED element is exposed is disposed on the printed circuit board, and thereafter, a fluorescent material is formed in such a manner as to fill the opening.

However, since LED elements have individual differences, and different characteristics respectively (tone and luminous intensity, etc.), even when a fluorescent material of a substantially uniform thickness can be formed over a plurality of LED elements, the tone and luminous intensity become inconsistent among the white light emitting diodes. Thus, there is a problem that yield of white light emitting diodes is reduced.

In addition, when there exists unevenness in shapes (for example, height, width and the like) of LED elements, or when the position accuracy of an LED element relative to pads formed on a printed circuit board is not good, it becomes difficult to form fluorescent materials of a substantially uniform thickness over the LED elements, resulting in a problem that the yield of white light emitting diodes is deteriorated due to variation in thickness.

Furthermore, in the case of a white light emitting diode having a high luminance, a large current is applied to the LED element, resulting in a problem that the LED element is heated to such an extent that the white light emitting diode fails eventually.

SUMMARY OF THE INVENTION

The present invention has been made in view of the above circumstances, and provides a light emitting diode which can dissipate heat being produced and released from the LED element with good efficiency so as to prevent the failure of white light emitting diodes and increase the yield of white light emitting diodes.

In some implementations, a light emitting diode (LED) of the invention comprising:

an LED element;

a fluorescent material element provided so as to cover the LED element;

a substrate on which the LED element is mounted; and a pair of electrode pads which are provided on the substrate and connected electrically to the LED element.

In the light emitting diode, the substrate is made of ceramics or silicon.

According to an aspect of the invention, since ceramics and silicon have a high thermal conductivity, by providing the substrate on which the LED element is mounted and made of ceramics or silicon, and the pair of electrodes adapted to be connected electrically to the LED element on the substrate, heat produced and released from the LED element is dissipated via the substrate with good efficiency, thereby making it possible to prevent the failure of the white light emitting diode.

In some implementations, a method of manufacturing a light emitting diode (LED) of the invention, comprising:

forming a pair of electrode pads on a substrate on which an LED element is mounted;

connecting the LED element to the pair of electrode pads electrically;

measuring a luminance of the LED and a wavelength of the LED by applying a voltage to the pair of electrode pads so as to make the LED element emit light; and forming a fluorescent material element based on results of the measurement of the luminance and the wavelength so that the luminance and the wavelength of the LED become a predetermined luminance and a predetermined wavelength, the fluorescent material element covering the LED element.

According to the other aspect of the invention, since the fluorescent material member having a thickness according to the luminance and wavelength of each LED element can be formed on the LED element by providing the luminance and wavelength measuring step and the fluorescent material forming step of forming the fluorescent material member in such a manner as to allow the light emitting diode to have predetermined luminance and wavelength based on results of the measurement in the luminance and wavelength measuring step, the yield of light emitting diodes can be increased.

In addition, in the method of manufacturing a light emitting diode, the fluorescent material element is two-layered, and
the method further comprising:

forming a first layer of the fluorescent material member so as to cover the LED element;

measuring the luminance and the wavelength of the LED in which the first layer of the fluorescent material member is formed; and forming a second layer of the fluorescent material member based on results of the measurement of the luminance and the wavelength of the LED in which the first layer of the fluorescent material member is formed, so that the luminance and the wavelength of the LED become a predetermined luminance and a predetermined wavelength.

In the method of manufacturing a light emitting diode, the first layer of the fluorescent material is formed by a printing method.

Thus, by forming the first layer of the fluorescent material member by the printing method and forming the second layer of the fluorescent material member in such a manner as to allow the light emitting diode to have the predetermined luminance and wavelength based on results of the measurement in the primary measuring step, the formation time of the fluorescent material member can be shortened, thereby making it possible to increase the productivity of light emitting diodes.

In the method of manufacturing a light emitting diode, the substrate is made of ceramics or silicon. Thus, by making up the substrate of ceramics or silicon of which deformation by heat is small, the displacement of the pair of electrode pads formed on the substrate can be suppressed, so as to increase the position accuracy of the LED element relative to the pair of electrode pads.

According to the invention, heat produced and released from the LED element can be dissipated with good efficiency to thereby prevent the failure of the light emitting diode, and the yield of light emitting devices can be increased.

DESCRIPTION OF THE PREFERRED EMBODIMENTS

Next, embodiments of the invention will be described based on the accompanying drawings.

First Embodiment

Figure 1:
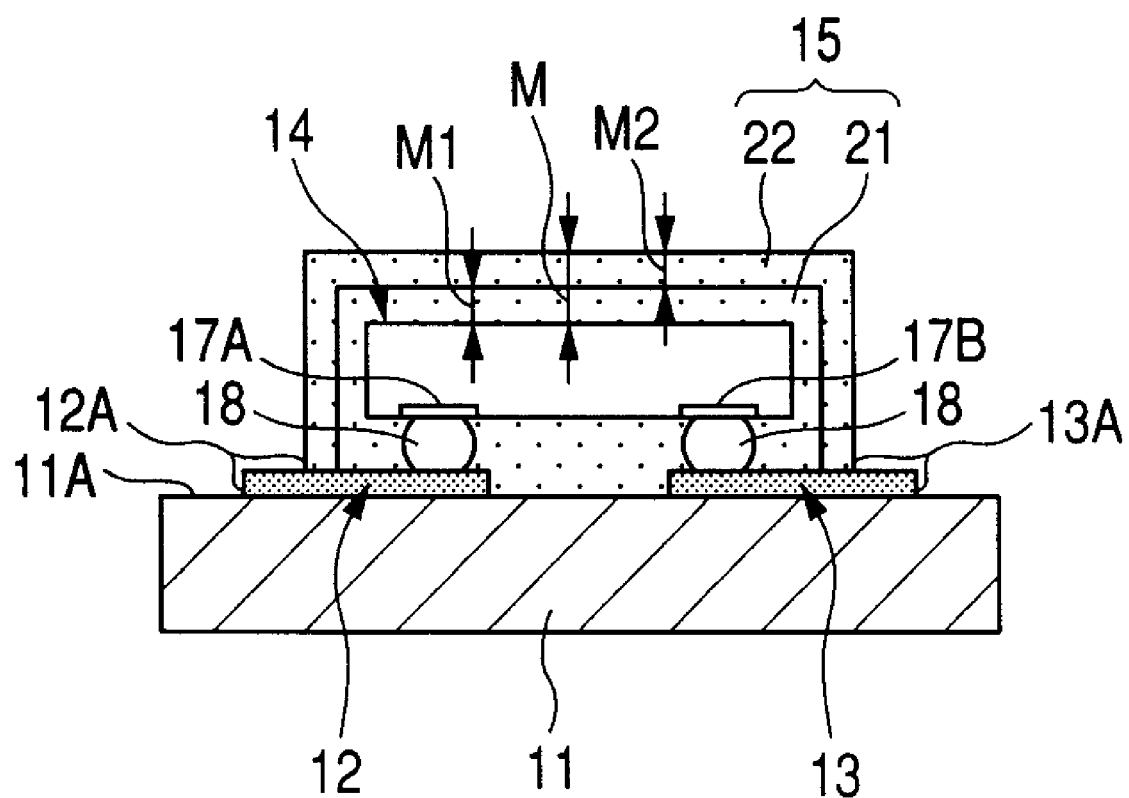
FIG. 1 is a sectional view of a light emitting diode according to a first embodiment of the invention.

FIG. 1 is a sectional view of a light emitting diode according to a first embodiment of the invention. In FIG. 1, M denotes the thickness of a fluorescent material 15 (hereinafter, referred to as a thickness M), M1 denotes the thickness of a fluorescent material 21 constituting a first layer (hereinafter, referred to as a thickness M1), and M2 denotes the thickness of a fluorescent material 22 constituting a second layer (hereinafter, referred to as a thickness M2).

Referring to FIG. 1, the light emitting diode 10 according to the first embodiment of the invention will be described. In this embodiment, the light emitting diode 10 will be described below by taking as an example a white light emitting diode which uses an LED element 14 which emits blue light.

The light emitting diode 10 has a substrate 11, a pair of electrode pads 12, 13, an LED element 14 and a fluorescent material 15.

The substrate 11 is such as to mount the LED element 14 thereon and is formed into a plate-like shape. Materials having high thermal conductivity are preferable for use as the material of the substrate 11, and to be specific, materials such as Cu, Ni, Cu alloy, ceramics and silicon may be used, for example. A lead frame which is made of Cu, Ni, Cu alloy or the like, for example, ceramic substrate, silicon substrate or the like can be used as the substrate 11.

By making up the substrate 11 on which the LED element 14 is mounted of the material having high thermal conductivity in this way, heat that is produced and released from the LED element 14 can be dissipated with good efficiency, thereby making it possible to prevent the failure of the light emitting diode 10.

In addition, in the event that a lead frame which is made of Cu, Ni, Cu alloy or the like, ceramic substrate, silicon substrate or the like is used as the substrate 11, since metal (for example, Cu, Ni, Cu alloy or the like), since ceramics and silicon is deformed little by heat, the displace of the pair of electrode pads 12, 13 which are formed on the substrate 11 can be suppressed, thereby making it possible to increase the position accuracy of the LED element 14 relative to the pair of electrode pads 12, 13.

The pair of electrode pads 12, 13 are provided on an upper surface 11A of the substrate 11. Either of the pair of electrode pads 12, 13 constitutes a positive electrode pad, and the other of them constitutes a negative electrode pad.

The electrode pad 12 has a connecting portion 12A. The connecting portion 12A is such as to connect the light emitting diode 10 to a printed circuit board (not shown) and is exposed from the fluorescent material 15. When mounting the light emitting diode 10 on the printed circuit board (not shown), a wire (not shown) which is electrically connected to a pad (not shown) on the printed circuit board is connected to the connecting portion 12A.

The electrode pad 13 has a connecting portion 13A. The connecting portion 13A is such as to connect the light emitting diode 10 to the printed circuit board (not shown) and is exposed from the fluorescent material 15. When mounting the light emitting diode 10 on the printed circuit board (not shown), a wire (not shown) which is electrically connected to a pad (not shown) on the printed circuit board is connected to the connecting portion 13A.

The LED element 14 has electrodes 17A, 17B. When a predetermined voltage is applied to the electrodes 17A, 17B, the LED element 14 emits blue light. The electrode 17A is electrically connected to the electrode pad 12A via a solder bump 18. In addition, the electrode 17B is electrically connected to the electrode pad 13B via a solder bump 18. By adopting this configuration, the LED element 14 is flip chip bonded to the electrode pads 12, 13.

The fluorescent material is a fluorescent material (fluorescent material member) which emits yellow color and is made up of the fluorescent material 21 of the first layer and the fluorescent material 22 of the second layer. The thickness M of the fluorescent material 15 is adjusted to a thickness which can provide predetermined luminance and wavelength (tone).

When used herein, the predetermined luminance and wavelength (tone) mean a luminance and a wavelength (tone) which can produce a yellow color which enables light emitted from the light emitting diode 10 to become a desired white light when the LED element 14 emits blue light. In addition, the thickness M of the fluorescent material 15 equal a sum of the thickness M1 of the fluorescent material 21 of the first layer and the thickness M2 of the fluorescent material 22 of the second layer. As the fluorescent material 15, a YAG-based fluorescent material can be used, for example.

The fluorescent material 21 of the first layer is provided in such a manner as to cover the LED element 14 and the solder bump 18. The thickness M1 of the fluorescent material 21 of the first layer is set to be smaller than the thickness M but larger than the thickness M2 of the fluorescent material 22 of the second layer. The fluorescent material 21 of the first layer can be formed by the printing method using a metallic mask, for example.

The fluorescent material 22 of the second layer is provided in such a manner as to cover the fluorescent material 21 of the first layer. The thickness M2 of the fluorescent material 22 of the second layer is set to be smaller than the thickness of the fluorescent material 21 of the first layer. The fluorescent material 22 of the second layer is such as to adjust the thickness M of the fluorescent material 15 so that the color of light emitted from the light emitting diode 10 becomes the desired white color.

The fluorescent material 21 of the first layer and the fluorescent material 22 of the second layer receive light emitted when the LED element 14 emits blue light so as to emit yellow light. The light emitting diode 10 mixes the blue light emitted from the LED element 14 with the yellow light from the fluorescent material 15, so as to emit white light.

According to the light emitting diode of the first embodiment, by providing the substrate 11 which is made of the material such as metal (for example, Cu, Ni, Cu alloy or the like), ceramics, silicon or the like which has high thermal conductivity and which is deformed little by heat and the pair of electrode pads 12, 13 which are provided on the substrate 11 in such a manner as to be electrically connected to the LED element 14, heat produced and released from the LED element 14 can be dissipated via the substrate 11 with good efficiency, thereby making it possible to prevent the failure of the light emitting diode 10.

Note that while in this embodiment, the description has been made by taking as an example the fluorescent material 15 having the double-layer construction, the fluorescent material 15 may be constructed as a single-layered fluorescent material. In this case, a fluorescent material 15 is formed in such a manner as to enable the color of light emitted from the light emitting diode 10 to become the desired white color by a vapor depositing method or ink jet method.

In addition, while in the embodiment, the description has been made by taking as an example the light emitting diode 10 which is made up of the LED element 14 which emits blue light and the fluorescent material 15 which luminesces in yellow, this first embodiment can also be applied to a light emitting diode which is made up of an LED element which emits a near-ultraviolet ray and three fluorescent materials which emits red color, blue and green, respectively. As this occurs, the fluorescent material is made up of a red fluorescent material, a blue fluorescent material and a green fluorescent material.

Figure 2:
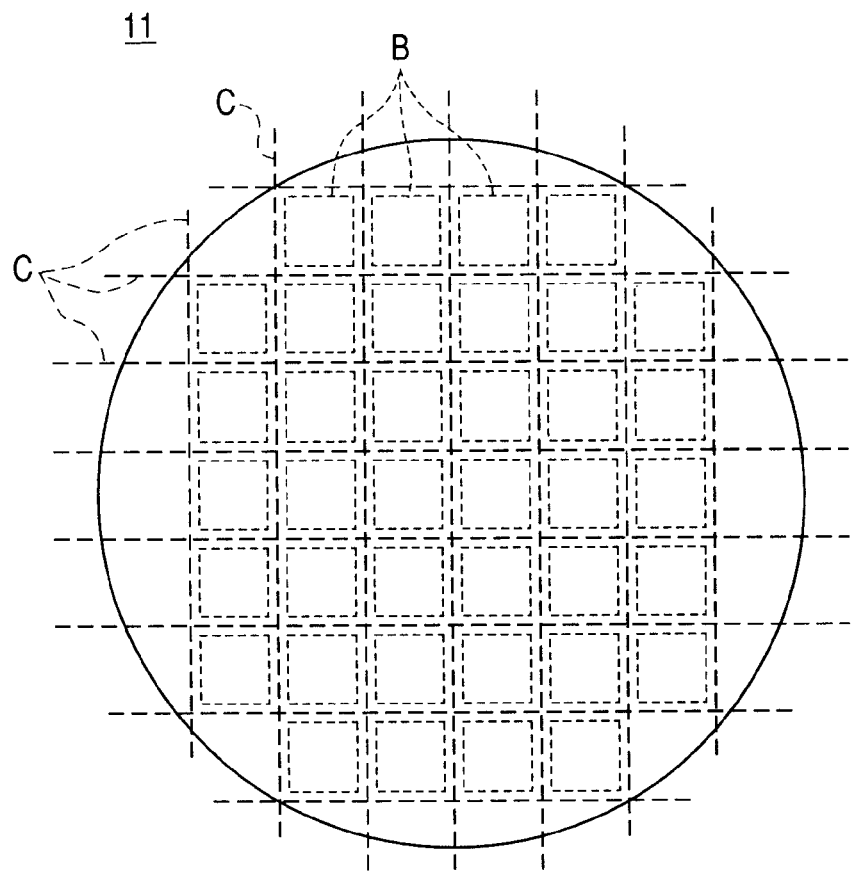
FIG. 2 is a plan view of a substrate on which the light emitting diode according to a first embodiment is formed.

FIG. 2 is a plan view of a substrate on which the light emitting diode according to the first embodiment is formed. In FIG. 2, B denotes an area where the light emitting diode 10 is formed (hereinafter, referred to as a light emitting diode forming area B) and C denotes a position along which a dicing blade cuts the substrate 11 after structures each corresponding to the light emitting diode 10 have been formed on the light emitting diode forming areas B (hereinafter, referred to as a cutting position C).

As shown in FIG. 2, a plurality of light emitting diode forming areas B are provided on the substrate 11 on which the light emitting diode 10 of the embodiment is formed. As the substrate 11 having the plurality of light emitting diode forming areas B, a silicon wafer can be used, for example.

FIGS. 3 to 7 are drawings showing a manufacturing process of the light emitting diode according to the first embodiment. In FIGS. 3 to 7, like reference numerals are given to like constituent portions to those of the light emitting diode 10 which has been described with reference to FIG. 1.

Next, referring to FIGS. 3 to 7, a manufacturing method of the light emitting diode 10 according to the first embodiment will be described. In FIGS. 3 to 7, the manufacturing method will be described by taking as an example a case where two light emitting diodes 10-1 (having an LED element 14-1) and 10-2 (having an LED element 14-2) which have predetermined luminous intensities and wavelengths are manufactured by preparing two LED elements 14-1, 14-2 which differ in luminous intensity and wavelength (tone) and forming a fluorescent material 15-1 (having a thickness M-1) on the LED element 14-1 and a fluorescent material 15-2 (having a thickness M-2) on the LED element 14-2.

Note that the light emitting diodes 10-1, 10-2 are configured the same as the light emitting diode 10 except that the fluorescent material 22 of the second layer provided on the light emitting diode 10, which is described with reference to FIG. 1, differs in thickness from fluorescent materials 22-1, 22-2 which are provided on the light emitting diodes 10-1, 10-2.

In addition, in FIGS. 3 to 7, an example is taken in which the light emitting diodes 10-1, 10-2 are manufactured on the substrate 11 having the plurality of light emitting diode forming areas B (refer to FIG. 2).

Figure 3:
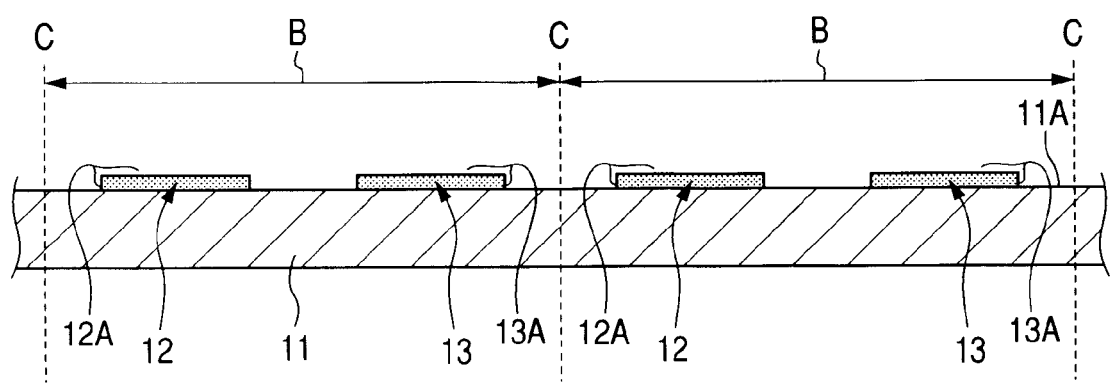
FIG. 3 is a drawing (Part 1) showing a manufacturing step of the light emitting diode according to a first embodiment.

To begin with, as shown in FIG. 3, a pair of electrodes 12, 13 are formed on each of a plurality of light emitting diode forming areas B on a substrate 11 made of silicon (in this case, to be specific, a silicon substrate) (an electrode forming step).

In this way, by forming on the substrate 11 made of silicon having high thermal conductivity pairs of electrodes 12, 13 to which LED elements 14-1, 14-2 are connected, heat produced and released from the LED elements 14-1, 14-2 can be dissipated with good efficiency. Note that in place of the silicon substrate, a ceramic substrate or a lead frame made of Cu, Ni, Cu alloy or the like may be used as the substrate 11, and in this case, too, a similar advantage to that obtained with the silicon substrate can be obtained.

Figure 4:
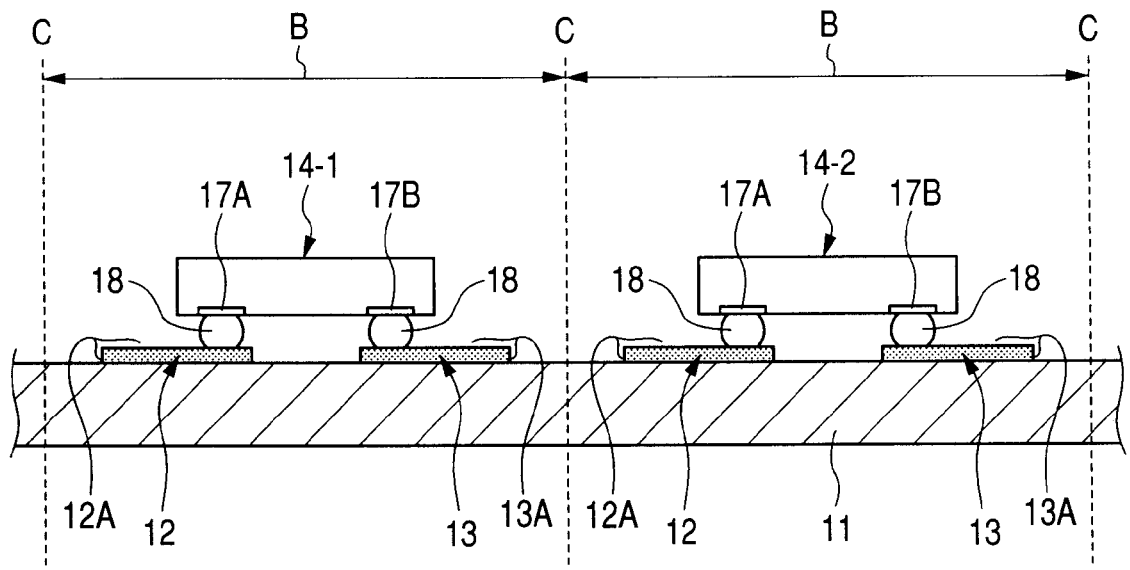
FIG. 4 is a drawing (Part 2) showing a manufacturing step of the light emitting diode according to a first embodiment.

Next, as shown in FIG. 4, the LED elements 14-1, 14-2 are electrically connected to the pairs of electrode pads 12, 13, respectively (an LED element connecting step). Specifically speaking, solder bumps 18 are provided on electrodes 17A, 17B of the LED elements 14-1, 14-2, so that the solder bumps 18 so provided are then connected to the pairs of electrode pads 12, 13.

Figure 5:
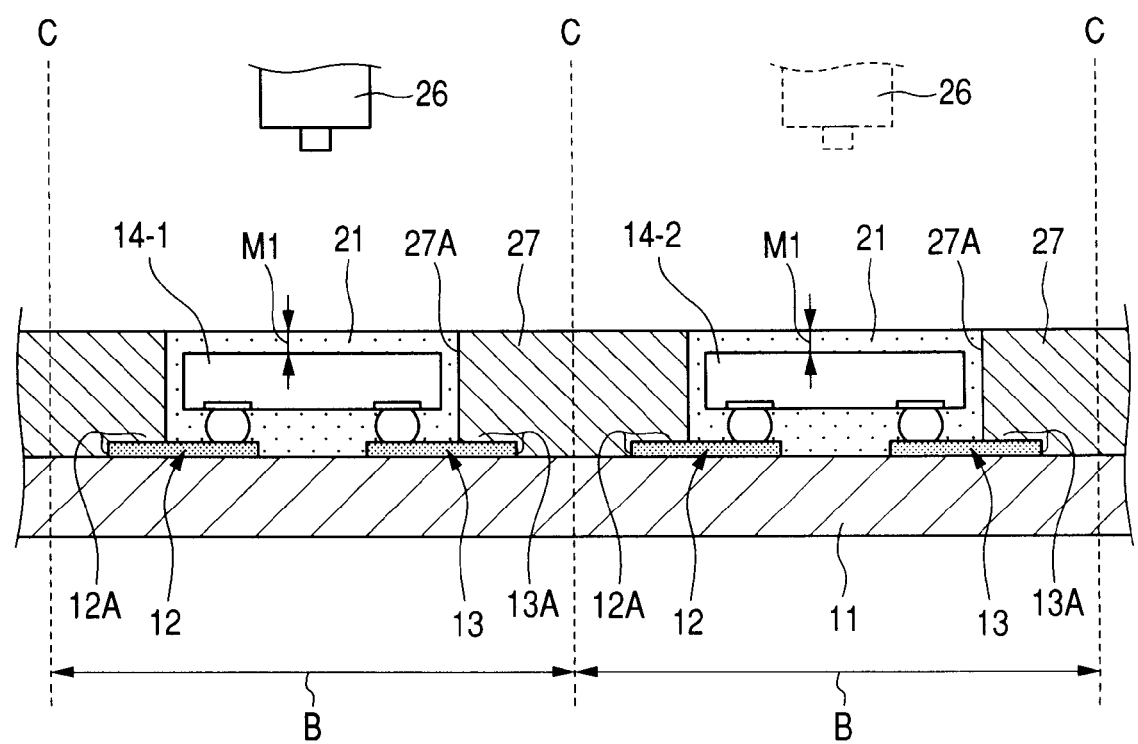
FIG. 5 is a drawing (Part 3) showing a manufacturing step of the light emitting diode according to a first embodiment.

Next, as shown in FIG. 5, a metallic mask 27 having openings 27A through which the LED elements 14-1, 14-2 are exposed is disposed on the substrate 11, and fluorescent materials 21 (having a thickness M1) of first layers are formed by a printing method (a fluorescent material first layer forming step). As this occurs, the thickness M1 of the fluorescent materials 21 of the first layers is set to be thinner than thicknesses M2-1, M2-2 (thicknesses which enable white lights of the light emitting diodes 10-1, 10-2 to have predetermined luminances and wavelengths) of fluorescent materials 15-1, 15-2 but be thicker than thicknesses M2-1, M2-2 of fluorescent materials 22-1, 22-2 of second layers. In addition, the metallic mask 27 is formed into a shape which covers connecting portions 12A, 13A of the pairs of electrode pads 12, 13, whereby the connecting portions 12A, 13A of the electrode pads 12, 13 can be prevented from being covered by the fluorescent materials 21 of the first layers.

The metallic mask 27 is removed from the substrate 11 after the fluorescent materials 21 of the first layers has been formed.

Accordingly, by using the printing method when forming the fluorescent materials 21 of the first layers, the fluorescent materials 21 of the first layers can be formed substantially simultaneously with respect to the plurality of LED elements 14-1, 14-2 being provided on the substrate 11. Thus, comparing to the case where the fluorescent materials 15-1, 15-2 are formed over the plurality of LED elements 14-1, 14-2 by using only an ink jet method or an evaporation method, formation time of the fluorescent materials 15-1, 15-2 becomes short. Therefore, productivity of the light emitting diodes 10-1, 10-2 can be improved.

Next, voltage is applied to the pairs of electrode pads 12, 13 after the fluorescent material first layer forming step so as to cause the LED elements 14-1, 14-2 on which the fluorescent materials 21 of the first layers have been formed to emit light sequentially for measurement of luminances and wavelengths (tones) of the light emitting diodes 10-1, 10-2 in which the fluorescent materials 21 of the first layers have been formed, by means of a spectral radiometer (a primary measuring step).

Specifically speaking, probes (not shown) are brought into contact with the pairs of electrode pads 12, 13, and the LED elements 14-1, 14-2 are caused to emit light sequentially for measurement by a spectral radiometer 26 of luminance and wavelength (tone) on each of the light emitting diodes 10-1, 10-2 in which the fluorescent materials 21 of the first layers have been formed. As the spectral radiometer 26, for example, a spectral radiometer SR-3 (manufactured by TOPCON TECHNOHOUSE CORPORATION, Ltd.) can be used.

Figure 6:
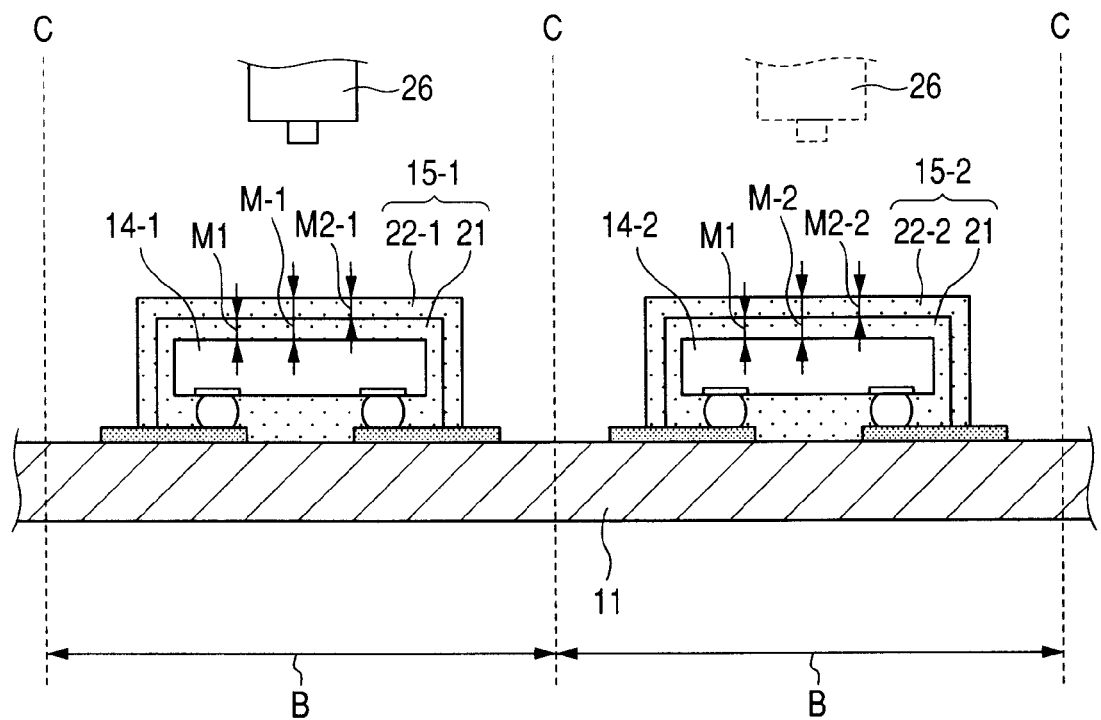
FIG. 6 is a drawing (Part 4) showing a manufacturing step of the light emitting diode according to a first embodiment.

Next, as shown in FIG. 6, while causing the LED elements 14-1, 14-2 to emit light sequentially, fluorescent materials 22-1, 22-2 of second layers are sequentially formed by an ink jet method so as to obtain predetermined luminances and wavelengths (a fluorescent material second layer forming step). In addition, while forming the fluorescent materials 22-1, 22-2 of the second layers, the luminances and wavelengths continue to be measured by the spectral radiometer 26 (a secondary measuring step). Additionally, whether or not the luminances and wavelengths measured during the secondary measuring step have reached the predetermined luminances and wavelengths is determined, and the formation of the fluorescent materials 22-1, 22-2 of the second layers is completed when the luminances and wavelengths measured are determined to have reached the predetermined luminances and wavelengths.

Thus, a structure corresponding to the light emitting diode 10-1 is formed in a light emitting diode forming area B shown in a left-hand side part of FIG. 6, and a structure corresponding to the light emitting diode 10-2 is formed in a light emitting diode forming area shown on a right-hand side part of FIG. 6.

Thus, by causing the LED elements 14-1, 14-2 to emit light for measurement of the luminances and wavelengths thereof in the midst of forming the fluorescent materials 22-1, 22-2 of the second layers so as to form the fluorescent materials 22-1, 22-2 of the second layers in the way described above, the light emitting diodes 10-1, 10-2 can be obtained which emit white light of the desired luminance and wavelength (tone), and hence the yield of light emitting diodes 10-1, 10-2 can be increased.

In addition, since the LED elements 14-1, 14-2 are heated by being caused to emit light, the fluorescent materials 15-1, 15-2 can be cured without providing separately a curing step.

Figure 7:
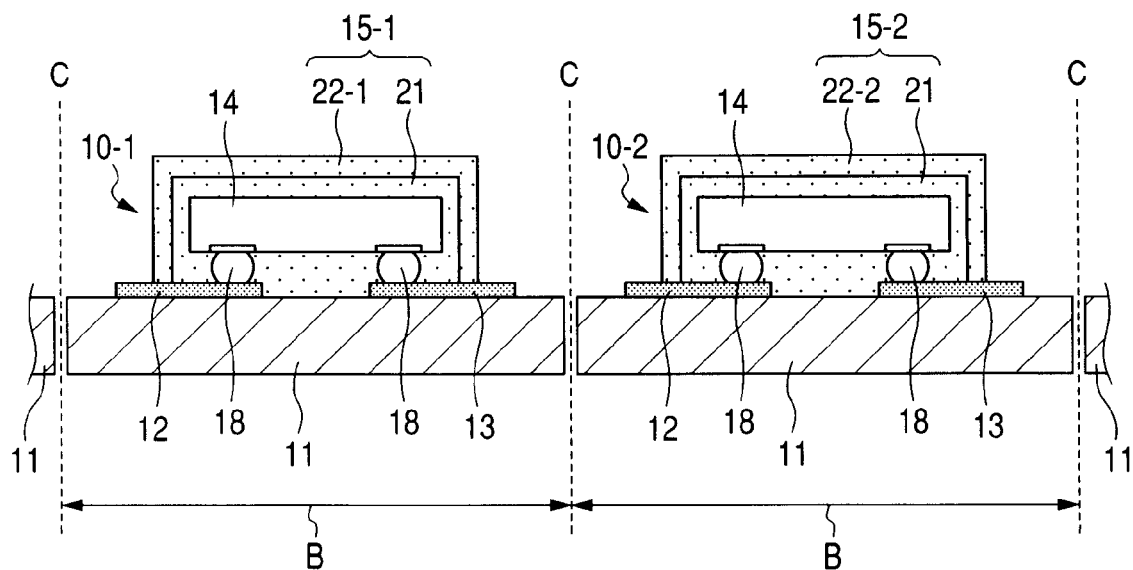
FIG. 7 is a drawing (Part 5) showing a manufacturing step of the light emitting diode according to a first embodiment.

Next, as shown in FIG. 7, the light emitting diodes 10-1, 10-2 are manufactured by cutting the substrate 11 along positions corresponding the cutting positions by means of a dicing blade (not shown).

According to the light emitting diode manufacturing method of this embodiment, the yield of light emitting diodes 10-1, 10-2 can be increased by forming the fluorescent materials 22-1, 22-2 of the second layers so that the light emitting diodes 10-1, 10-2 have the predetermined luminances and wavelengths in such a state that the LED elements 14-1, 14-2 are caused to emit light.

Note that while the light emitting diode manufacturing method of the embodiment has been described, for better explanation, as the light emitting diodes 10-1, 10-2 being manufactured in the light emitting diode forming areas B on the substrate 11 where the two LED elements 14-1, 14-2 having the different tones and luminance intensities are bonded, LED elements 14, not shown, are bonded to other light emitting diode forming areas B on the substrate 11, and in the step shown in FIG. 7, a plurality of light emitting diodes 10 are manufactured in addition to the light emitting diodes 10-1, 10-2.

In addition, while the light emitting diode manufacturing method of the embodiment has been described as the fluorescent materials 21 of the first layers and the fluorescent materials 22-1, 22-2 of the second layers being formed by the different methods, for example, the fluorescent materials 21 of the first layers and the fluorescent materials 22-1, 22-2 of the second layers may be formed at one time by the ink jet method or vapor deposition method so that the light emitting diodes 10-1, 10-2 can have the predetermined luminances and wavelengths (a fluorescent material forming step) while causing the LED elements 14-1, 14-2 to emit light sequentially for measurement of luminances and wavelengths (tones) (a luminance and wavelength measuring step).

Second Embodiment

Figure 8:
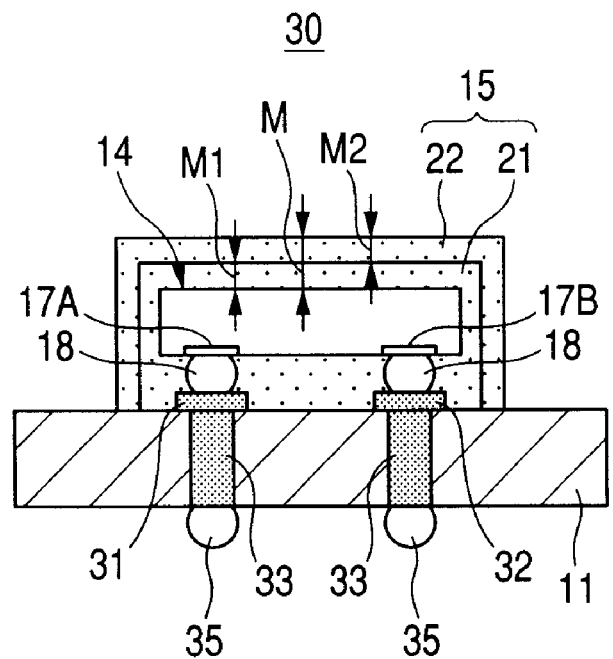
FIG. 8 is a sectional view of a light emitting diode according to a second embodiment of the invention.

FIG. 8 is a sectional view of a light emitting diode according to a second embodiment of the invention. In FIG. 8, like reference numerals are given to like constituent portions to those of the light emitting diode 10 of the first embodiment, and the description thereof will be omitted.

Referring to FIG. 8, the light emitting diode 30 according to the second embodiment of the invention will be described. The light emitting diode 30 is configured the same as the light emitting diode 10 of the first embodiment except that in place of the electrode pads 12, 13 provided on the light emitting diode 10 of the first embodiment, electrode pads 31, 32 are provided and furthermore, through vias 33 and external connecting terminals 35 are provided.

The electrode pads 31, 32 are provided on a substrate 11 in such a manner as to face positions where the through vias 33 are formed. The electrode pads 31, 32 are covered by a fluorescent material 21 of a first layer. Either of the electrode pads 31, 32 is a positive electrode pad, and the other of them is a negative electrode pad. LED elements 14, 14 are electrically connected to the electrode pads 31, 32 via solder bumps 18.

The through via 33 is provided in such a manner as to pass through the substrate 11. Either of the electrode pads 31, 32 is provided at one end portion of the through via 33 and the external connecting terminal 35 is provided at the other end portion thereof. The through vias 33 establish electrical connections between the electrode pads 31, 32 and the external connecting terminals 35.

The external connecting terminals 35 are terminals which establish electrical connections to a printed circuit board (not shown). Solder balls, for example, can be used as the external connecting terminals 35.

Thus, also with the light emitting diode 30 of the second embodiment which includes the through vias 33 which are electrically connected to the electrode pads 31, 32 and the external connecting terminals 35 which are electrically connected to the through vias 33 on an opposite side of the substrate 11 to a side thereof where the LED elements 14 are connected, the same advantage as that obtained with the light emitting diode 10 of the first embodiment can be obtained.

Note that this embodiment can be applied to a light emitting diode which includes an LED element which emits a near-ultraviolet ray and fluorescent materials which emit three colors of red, blue and green.

In addition, the light emitting diode 30 of the second embodiment can be manufactured by the same method as that used to manufacture the light emitting diode 10 of the first embodiment except that the electrode pads 31, 32, through vias 33 and external connecting terminals 35 are formed on the substrate 11 by known methods.

Third Embodiment

Figure 9:
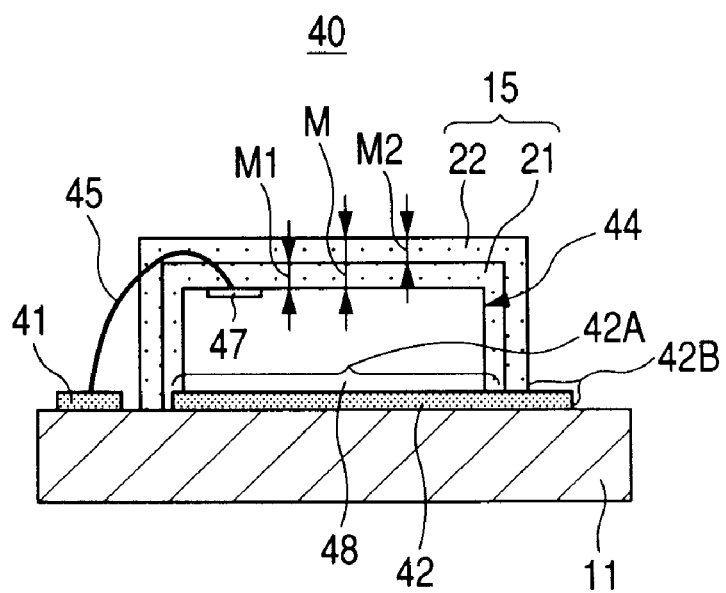
FIG. 9 is a sectional view of a light emitting diode according to a third embodiment of the invention.

FIG. 9 is a sectional view of a light emitting diode according to a third embodiment of the invention. In FIG. 9, like reference numerals are given to like constituent portions to those of the light emitting diode 10 of the first embodiment, and the description thereof will be omitted.

Referring to FIG. 9, the light emitting diode 40 according to the third embodiment of the invention will be described. The light emitting diode 40 has a substrate 11, a fluorescent material 15, electrode pads 41, 42, an LED element 44 and a wire 45.

Either of the electrode pads 41, 42 is a positive electrode pad and the other of them is a negative electrode pad. The electrode pad 41 is provided on the substrate 11. The electrode pad 41 is electrically connected to an electrode 47 of the LED element 44 via the wire 45. For example, when mounting the light emitting diode 40 on a printed circuit board (not shown) a wire (not shown) which is electrically connected to a pad (not shown) on the printed circuit board is connected to the electrode pad 41.

The electrode pad 42 is provided on the substrate 11. The electrode pad 42 has an electrode connecting portion 42A and a connecting portion 42B. The electrode connecting portion 42A is covered by the fluorescent material 15 and an electrode 48 of the LED element 44 is connected to the electrode connecting portion 42A. The connecting portion 42B is exposed from the fluorescent material 15 and is electrically connected to a pad (not shown) of the printed circuit board via a wire, not shown.

The LED element 44 is provided on the electrode connecting portion 42A and is covered by the fluorescent material 15. The LED element 44 is a device which emits blue light. The LED element 44 is configured the same as the LED element 14 described in the first embodiment except that in place of the electrodes 17A, 17B provided on the LED element 14, the electrodes 47, 48 are provided.

Either of the electrodes 47, 48 is a positive electrode and the other of them is a negative electrode. The electrode 47 is provided on an upper surface of the LED element 44. The electrode 47 is electrically connected to the electrode pad 41 via the wire 45. The electrode 48 is provided on a lower surface of the LED element 44. The electrode 48 is electrically connected to the electrode connecting portion 42A via a solder, not shown.

Also with the light emitting diode 40 of the third embodiment which is configured as has been described above, the same advantage as that obtained with the light emitting diode 10 of the first embodiment can be obtained.

Note that this embodiment can be applied to a light emitting diode which includes a LED element which emits a near-ultraviolet ray and fluorescent materials which emit three colors of red, blue and green.

In addition, the fluorescent material 15 of the light emitting diode 40 of the third embodiment can be manufactured by the same method as that used to manufacture the fluorescent material 15 of the light emitting diode 10 of the first embodiment.

Thus, while the preferred embodiments of the invention have been described in detail heretofore, the invention is not limited to those specific embodiments, and hence, various modifications and changes can be made without departing from the spirit and scope of the invention which are described in the claims of the invention.

The invention can be applied to a light emitting diode which can dissipate heat produced and released from an LED element with good efficiency so as to prevent the failure of the light emitting diode and increase the yield thereof and a manufacturing method thereof.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A method of manufacturing a light emitting device, the method comprising:
    forming a pair of electrode pads on a substrate;
    mounting an LED element on the substrate;
    connecting the LED element to the pair of electrode pads electrically;
    measuring a luminance of the LED element and a wavelength of the LED element by applying a voltage to the pair of electrode pads so as to make the LED element emit light; and
    covering the LED element with a fluorescent material based on measurement results of the luminance and the wavelength, so that a luminance and a wavelength of the LED element covered with the fluorescent material is set to a predetermined luminance and a predetermined wavelength,
    wherein the steps of: measuring a luminance of the LED and a wavelength of the LED by applying a voltage to the pair of electrode pads so as to make the LED element emit light; and covering the LED element with a fluorescent material based on measurement results of the luminance and the wavelength, so that a luminance and a wavelength of the LED element covered with the fluorescent material is set to a predetermined luminance and a predetermined wavelength; are performed simultaneously.

2. The method of manufacturing a light emitting diode according to claim 1, wherein the fluorescent material element is two-layered, and the method further comprising: forming a first layer of the fluorescent material member so as to cover the LED element; measuring the luminance and the wavelength of the LED in which the first layer of the fluorescent material member is formed; and forming a second layer of the fluorescent material member based on results of the measurement of the luminance and the wavelength of the LED in which the first layer of the fluorescent material member is formed, so that the luminance and the wavelength of the LED become a predetermined luminance and a predetermined wavelength.

3. The method of manufacturing a light emitting diode according to claim 2, wherein the formation of the second layer of the fluorescent material member includes measuring the luminance and the wavelength of the LED by applying a voltage to the pair of electrode pads so as to make the LED element emit light.

4. The method of manufacturing a light emitting diode according to claim 1, wherein the substrate is made of ceramics or silicon.

5. The method of manufacturing a light emitting diode according to claim 2, wherein the first layer of the fluorescent material is formed by a printing method.

* * * * *